United States Patent [19]
Yedur et al.

[11] Patent Number: 6,117,618
[45] Date of Patent: Sep. 12, 2000

[54] CARBONIZED ANTIREFLECTIVE COATING PRODUCED BY SPIN-ON POLYMER MATERIAL

[75] Inventors: Sanjay Yedur, Santa Clara; Bhanwar Singh, Morgan Hill; Bharath Rangarajan, Santa Clara; Michael Templeton, Atherton, all of Calif.

[73] Assignee: Advanced Micro Devices, Inc., Sunnyvale, Calif.

[21] Appl. No.: 09/185,683

[22] Filed: Nov. 4, 1998

[51] Int. Cl.⁷ ........................................................ G03C 5/00
[52] U.S. Cl. .......................... 430/296; 430/311; 430/512; 430/514; 430/942; 430/945; 430/950; 427/554
[58] Field of Search ..................................... 430/296, 311, 430/312, 313, 322, 323, 945, 512, 514, 950, 942; 216/41; 427/96, 554, 557, 558, 596

[56] References Cited

U.S. PATENT DOCUMENTS

| | | | |
|---|---|---|---|
| 4,286,250 | 8/1981 | Sacchetti ................................. | 338/306 |
| 4,584,456 | 4/1986 | Oodaira et al. .................... | 219/121.83 |
| 5,137,751 | 8/1992 | Burgess et al. .......................... | 427/123 |
| 5,437,961 | 8/1995 | Yano et al. .............................. | 430/313 |

OTHER PUBLICATIONS

IBM Technical Disclosure Bulletin, "Carbonized Resist As Directly–Patternable Mask Absorber", Mar. 1988, vol. 30, issue 10, p 402–406, NN8803402.

*Primary Examiner*—Christopher G. Young
*Attorney, Agent, or Firm*—Renner, Otto, Boisslle & Sklar LLP

[57] ABSTRACT

In one embodiment, the present invention relates to a method of making a carbonized antireflection coating involving the steps of depositing a polymer layer on a semiconductor substrate; and carbonizing at least a portion of the polymer layer in an inert atmosphere to provide the carbonized antireflection coating. In another embodiment, the present invention relates to a method of improving critical dimensional control during lithography, involving the steps of providing a semiconductor substrate; depositing a polymer layer on the semiconductor substrate; carbonizing at least a portion of the polymer layer in an inert atmosphere to provide a carbonized antireflection coating; depositing a photoresist over the carbonized antireflection coating; and patterning the photoresist.

20 Claims, 2 Drawing Sheets

CARBONIZED ANTIREFLECTIVE COATING PRODUCED BY SPIN-ON POLYMER MATERIAL

TECHNICAL FIELD

The present invention generally relates to making and using a carbonized antireflection coating using a spin-on polymer material. In particular, the present invention relates to a carbonized antireflection coating made by carbonizing a polymer layer.

BACKGROUND ART

Microlithography processes for making miniaturized electronic components, such as in the fabrication of computer chips and integrated circuits, involve using photoresists. Generally, a coating or film of a photoresist is applied to a substrate material, such as a silicon wafer used for making integrated circuits. The substrate may contain any number of layers or devices thereon. The photoresist coated substrate is baked to evaporate any solvent in the photoresist composition and to fix the photoresist coating onto the substrate. The baked coated surface of the substrate is next subjected to selective radiation; that is, an image-wise exposure to radiation.

This radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist.

Especially with the trend towards miniaturization of semiconductor devices, there are problems that result from the back reflection of light from highly reflective substrates (back reflection from layers underneath the photoresist). Two deleterious effects of back reflectivity are thin film interference and reflective notching. Thin film interference results in a changes in critical linewidth dimensions caused by variations in the total light intensity in the photoresist film as the thickness of the photoresist changes. Reflective notching becomes severe as the photoresist is patterned over substrates containing topographical features, which tend to scatter light through the photoresist film, leading to linewidth variations, and in extreme cases, forming regions with complete photoresist loss.

Dyed photoresists have been utilized in an effort to solve these reflectivity problems. However, dyed photoresists only reduce reflectivity from the underlying substrate, they do not totally eliminate the reflectivity. Additional shortcomings associated with dyed photoresists are that dyed photoresists tend to cause reduction in the lithographic performance of the photoresist, the undesirable possible sublimation of the dye, and incompatibility of the dye in the photoresist films.

To prevent reflection of activating radiation into a photoresist coating, it is known to provide antireflection layers or antireflection coatings (ARCs) between a substrate and a photoresist layer. ARCs generally function by absorbing the radiation used for exposing the photoresist; that is, reducing reflectivity at the photoresist/underlying substrate interface. ARCs may comprise an absorbing dye dispersed in a polymer binder, though some polymers contain sufficient chromopores (or characteristics thereof) whereby a dye is not required. When used, the dye is selected to absorb and attenuate radiation at the wavelength used to expose the photoresist layer thus reducing the incidence of radiation reflected back into the photoresist layer. During conventional processing of an integrated circuit substrate coated with the combination of an ARC and a photoresist layer, the photoresist is patterned to form a mask defining a desired pattern.

To alter the underlying substrate, the ARC must be removed to bare the underlying substrate in a desired pattern. However, there are problems associated with removal of the ARC including incomplete removal, and/or undesirable damage, removal or interaction with the photoresist or underlying substrate. In addition to difficulties associated with removal of an ARC, other problems are often encountered when an ARC is used in combination with a photoresist coating. One such problem is that of selecting an antireflective coating that is compatible with the photoresist used. The ARC should be inert with respect to the photoresist coating while firmly bonding to the photoresist coating. Another problem is that of selecting an ARC that firmly bonds to the underlying substrate to avoid lift-off of the unremoved photoresist coating (from development) during processing of the underlying substrate. Yet another problem is depositing an ARC without defects. There are also problems associated with selecting ARCs having desirable properties at certain wavelengths that simultaneously possess the above mentioned desirable compatibility properties.

SUMMARY OF THE INVENTION

The present invention provides a carbonized ARC that is stable and particularly effective at absorbing light having a wavelength of less than about 425 nm. The present invention also provides a carbonized ARC that is particularly effective when used over polysilicon or metal. Another advantage to the carbonized ARC of the present invention is that it is possible to adjust the reflectivity by controlling the degree of carbonization. Thus, it is possible to tailor the reflectivity of the carbonized ARC to that which is necessary in a specific circumstance. Since the carbonized ARC does not contain any metal components, harm to the resulting semiconductor device is minimized and compatibility with other features of the semiconductor materials is improved.

In one embodiment, the present invention relates to a method of making a carbonized antireflection coating involving the steps of depositing a polymer layer on a semiconductor substrate; and carbonizing at least a portion of the polymer layer in an inert atmosphere to provide the carbonized antireflection coating.

In another embodiment, the present invention relates to a method of improving critical dimensional control during lithography, involving the steps of providing a semiconductor substrate; depositing a polymer layer on the semiconductor substrate; carbonizing at least a portion of the polymer layer in an inert atmosphere to provide a carbonized antireflection coating; depositing a photoresist over the carbonized antireflection coating; and patterning the photoresist.

In yet another embodiment, the present invention relates to a method of processing a semiconductor substrate, involving the steps of providing a semiconductor substrate having an uppermost layer comprising polysilicon; spin-coating a polymer layer on the semiconductor substrate; carbonizing from about 75% to about 100% of the polymer layer using an infrared laser in an inert atmosphere to provide a carbonized antireflection coating; depositing a photoresist over the carbonized antireflection coating; and patterning the photoresist.

DISCLOSURE OF INVENTION

Figure 1:
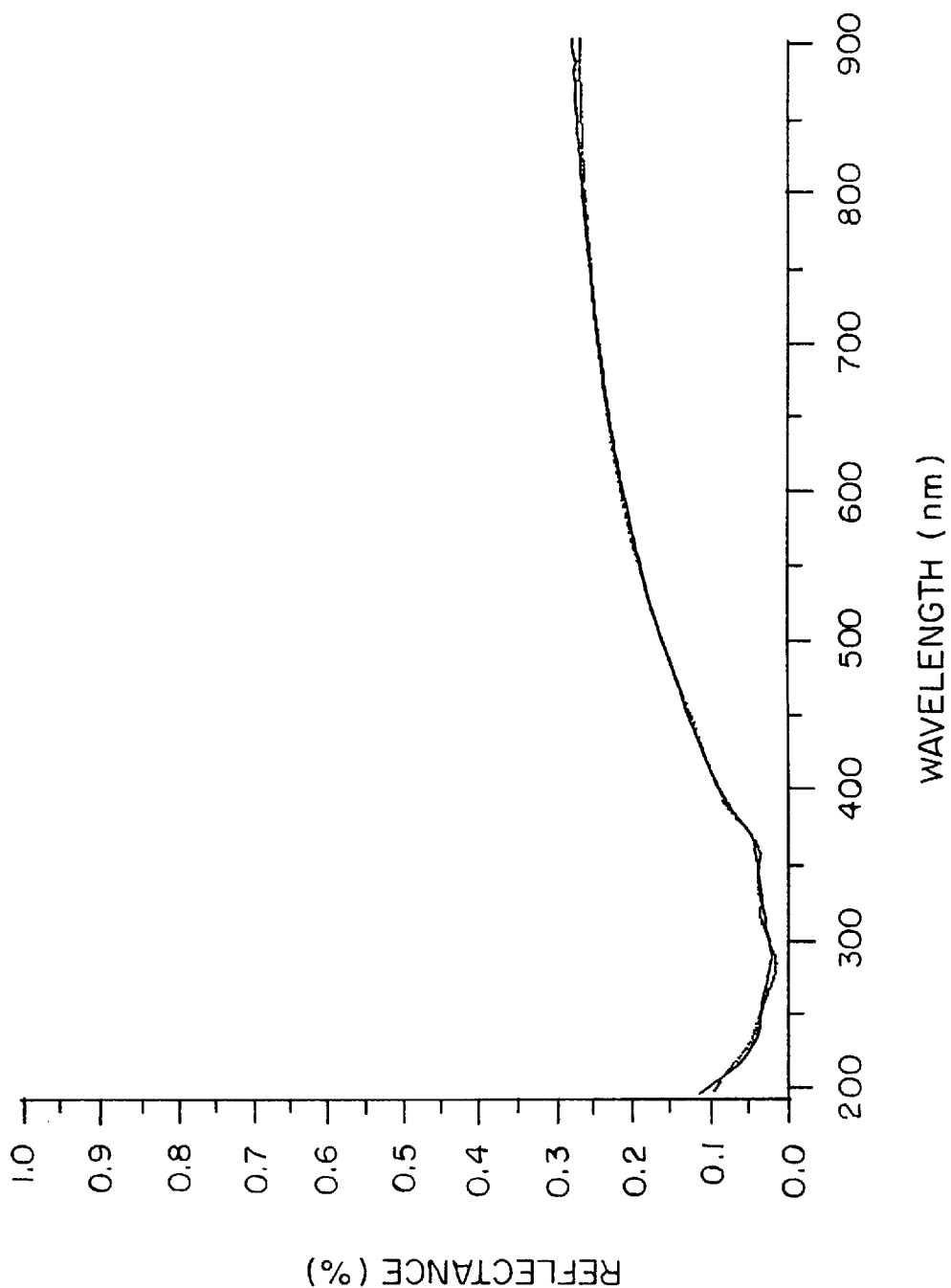
FIG. 1 illustrates a graph representing the relationship between reflectivity and wavelength for a carbonized polymer ARC according to one embodiment of the present invention.

The present invention involves making and using a carbonized ARC using a spin-on polymer material. The present invention more specifically involves making and using a carbonized ARC over underlying layers such as polysilicon or metal by carbonizing photoresist material. The reflectivity of the carbonized ARC may be altered or controlled by adjusting the degree of carbonization and the thickness of the ARC. The carbonized ARC according to the invention presents little or no threat of damage or contamination to sensitive underlying layers such as polysilicon.

The carbonized ARCs of the present invention are used over an underlying layer having a reflectivity that may deleteriously affect the photoresist patterning process if an ARC is not used. In one embodiment, the underlying layer is a polysilicon layer. The polysilicon may be doped or undoped. In another embodiment, the underlying layer is a metal layer, a metal silicide layer, an oxide layer or a nitride layer. Specific examples of underlying layers include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, metal oxides, metal nitrides and any other alloys thereof. Although the reflectivity may vary for each such layer, typically underlying layers have reflectivities of about 50% or more.

A carbonized ARC according to the invention is formed using a two-step process; namely, spin-coating a polymer layer and carbonizing the spin-on polymer layer. In particular, a carbonized polymer ARC of the present invention is made by initially forming an polymer layer on an underlying layer. The polymer layer can be formed using any suitable technique including spin-on techniques, such as those used to apply a photoresist material to a semiconductor substrate. Any polymer material can be used, such as an organic polymeric material. Polymer materials include polymer dielectric layers and polymer photoresists. Examples of polymer materials include organic polymers such as polyesters, polyacrylates, polymethacrylates, polycarbonates, polyimides, polysulfones, polyureas, polystyrenes, polyaryl ethers, epoxy based polymers, novolaks and so on.

In a preferred embodiment, the photoresist material which is used in connection with the carbonized ARC is initially applied to a semiconductor substrate as the initial polymer layer (to be converted into the carbonized ARC). In this embodiment, process complexity is minimized as a first layer of the photoresist is processed into the carbonized ARC and a second layer of the photoresist is used as a photoresist using standard photolithography techniques. After the polymer material is spin-coated on the semiconductor substrate, the substrate is typically heated to drive off any residual solvent.

Any polymer photoresist material may be used to form the polymer layer. For example, a 193 nm sensitive photoresist, an I-line, H-line, G-line, E-line, deep UV or chemically amplified photoresist material may be spin-coated on a substrate surface. An example of a deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, Brewer and IBM. Preferred examples of polymer materials include products under the trade designation CD 11 from Brewer and AR 2 and AR 3 from Shipley Company. The polymer material is applied to a thickness from about 200 Å to about 10,000 Å, although the initial thickness of the spin-on polymer material is not critical to the invention.

After the polymer layer is formed, the polymer layer is carbonized in an inert atmosphere. Carbonization is performed by heating, using an electron beam, infrared (IR) radiation (via laser, oven, or lamp) or a laser beam. Since using an electron beam or a laser beam affords better control, these techniques are preferred. IR light having a wavelength from about 0.75 $\mu$m to about 1000 $\mu$mm is also preferred. Any suitable laser may used including IR lasers, gas lasers, solid state lasers, organic dye lasers, chemical lasers and excimer lasers. Pulsed or continuous laser light may be used. Examples of IR lasers include those using near IR light (from about 0.75 $\mu$m to about 3 $\mu$m), short IR light (from about 3 $\mu$m to about 6 $\mu$m), long IR light (from about 6 $\mu$m to about 15 $\mu$m), and far IR light (from about 15 $\mu$m to about 1000 $\mu$m). Examples of various excimer lasers include a XeCl excimer laser having a wavelength of about 308 nm, a KrF excimer laser having a wavelength of about 248 nm, an ArF excimer laser having a wavelength of about 193 nm, and an $F_2$ excimer laser having a wavelength of about 157 nm. The heat, laser, e-beam or IR light is applied for a time sufficient to achieve a desired degree of carbonization.

An inert atmosphere means that carbonization is performed in the absence of an oxygen containing gas (such as in the absence of air, $O_2$, $H_2O$, and the like). Examples of inert atmospheres include no air or gas (under vacuum), nitrogen, and noble gases such as helium, neon, argon, krypton and xenon.

The reflectivity of the resultant carbonized ARC depends upon the degree of carbonization and the thickness of the resultant layer. Generally, as the degree of carbonization increases, the resultant reflectivity decreases. Depending upon the reflectivity requirements of a given circumstance, the degree of carbonization can be tailored thereto. Over-carbonization must be avoided in order to minimize or prevent detrimental effects to the underlying layer. In one embodiment, the degree of carbonization is from about 75% to about 100% (from about 75% to about 100% of the polymer layer is carbonized). In another embodiment, the degree of carbonization is from about 80% to about 99%. In yet another embodiment, the degree of carbonization is from about 90% to about 98%.

All or a portion of the polymer layer may be carbonized. In most embodiments, all portions of the polymer layer are carbonized substantially uniformly. However, in some embodiments, it is desirable to carbonize more thoroughly (higher degree of carbonization) certain portions of the polymer layer where reflectivity concerns are relatively high compared to other portions of the polymer layer where reflectivity concerns are relatively small. The resultant carbonized ARC is characterized as a low defect film since there is a high degree of reliability associated with spin-coating a polymer material and carbonizing all or a potion of the polymer material.

The carbonized ARC is formed to a suitable thickness to exhibit a desired reflectivity. Generally, as the thickness of the carbonized ARC increases, the resultant reflectivity decreases. In one embodiment, the carbonized ARC formed in accordance with the present invention has a thickness from about 200 Å to about 1500 Å. In another embodiment, the carbonized ARC has a thickness from about 400 Å to about 1000 Å. In yet another embodiment, the carbonized ARC has a thickness from about 500 Å to about 900 Å.

The carbonized ARC formed in accordance with the present invention has strong absorption characteristics at wavelengths below about 425 nm. In another embodiment, the carbonized ARC formed in accordance with the present invention has strong absorption characteristics at wavelengths from about 130 nm about 400 nm. In yet another embodiment, the carbonized ARC formed in accordance with the present invention has strong absorption characteristics at wavelengths from about 225 nm about 375 nm. In still yet another embodiment, the carbonized ARC formed in accordance with the present invention has strong absorption characteristics at wavelengths from about 240 nm about 365 nm.

In one embodiment, a carbonized ARC formed in accordance with the invention over a polysilicon layer or a metal layer has a reflectivity from about 0% to about 15% (below about 15%) at wavelengths from about 190 nm to about 400 nm. In another embodiment, a carbonized ARC formed in accordance with the invention over a polysilicon layer or a metal layer has a reflectivity from about 0% to about 10% (below about 10%) at wavelengths from about 225 nm to about 375 nm. In yet another embodiment, a carbonized ARC formed in accordance with the invention over a polysilicon layer or a metal layer has a reflectivity from about 0% to about 5% (below about 5%) at wavelengths from about 240 nm to about 365 nm.

Referring to FIG. 1, a graph is shown reporting the relationship between reflectivity and wavelength for a 100% carbonized polymer ARC (100% of the polymer is carbonized) having a thickness of about 540 Å formed over a polysilicon substrate.

In this connection, the carbonized ARC reduces the apparent reflectivity of an underlying layer (comparing the reflectivity of an underlying layer such as polysilicon layer or a metal layer with the reflectivity of a carbonized ARC over the underlying layer). In one embodiment, the difference between the reflectivity of the underlying layer and the reflectivity of the carbonized ARC over the underlying layer is at least about 40% (for instance, an underlying layer having a reflectivity of 50% and a carbonized ARC over the underlying layer having a reflectivity of 8%). In another embodiment, the difference between the reflectivity of a polysilicon layer and the reflectivity of carbonized ARC over the polysilicon layer is at least about 45%.

Figure 2:
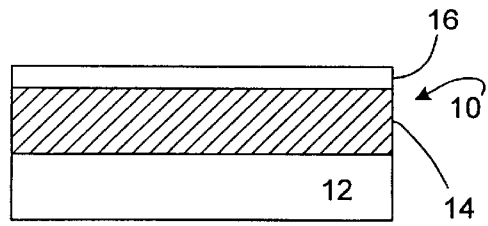
FIG. 2 illustrates a cross-sectional view of the methods according to one aspect of the present invention.

Referring to FIGS. 2 to 6, a general embodiment of the present invention is described. Referring to FIG. 2, a portion of a semiconductor structure 10 is shown with silicon substrate 12. Underlying layer 14 (relative to the ARC) may be one or more layers of semiconductor materials wherein at least a portion of the top surface has a reflectivity above about 50%. Although shown as continuous, the underlying layer 14 may be continuous or intermittent. A spin-on polymer layer 16 is formed over the underlying layer 14 having a desired thickness, such as 500 Å. The polymer layer 16 is then heat treated to drive off any excess solvent.

Figure 3:
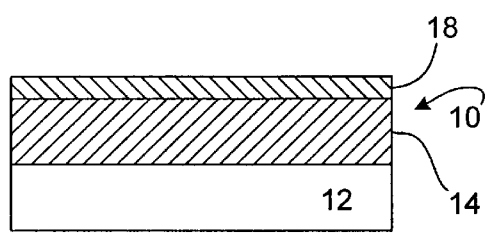
FIG. 3 illustrates a cross-sectional view of the methods according to one aspect of the present invention.

Referring to FIG. 3, a carbonized ARC 18 is formed over the underlying layer 14 by irradiating the spin-on polymer layer 16 with laser light or e-beam in an inert atmosphere for a time sufficient to provide a desired degree of carbonization to the polymer layer, thereby forming a carbonized layer having a desired thickness, such as 400 Å. The degree of carbonization of the polymer layer and the thickness of the resultant carbonized layer may be modified to adjust the reflectivity of the resultant carbonized layer in light of the specific reflectivity of the underlying layer 14.

Figure 4:
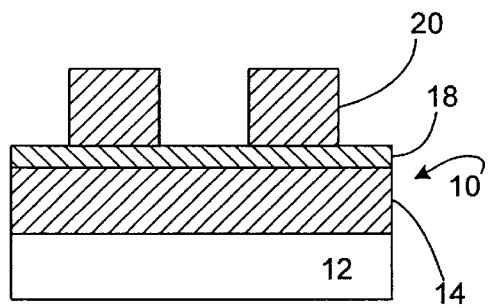
FIG. 4 illustrates a cross-sectional view of the methods according to one aspect of the present invention.

Referring to FIG. 4, a photoresist 20 is patterned over the carbonized ARC 18 using suitable photolithographic techniques. That is, a suitable photoresist material is deposited over the carbonized ARC 18 using known techniques, such as using conventional spin-coating techniques, the photoresist material is selectively exposed to radiation, and the photoresist material is developed to yield a patterned photoresist 20. The patterned photoresist 20 is formed using electromagnetic radiation having a relatively small wavelength (for example, less than 425 nm). The exposed portion of the carbonized ARC 18 may have any desired cross-section, width or diameter, such as about 0.35 $\mu$m, about 0.25 $\mu$m, about 0.18 $\mu$m, about 0.15 $\mu$m, about 0.1 $\mu$m and/or about 0.05 $\mu$m.

Figure 5:
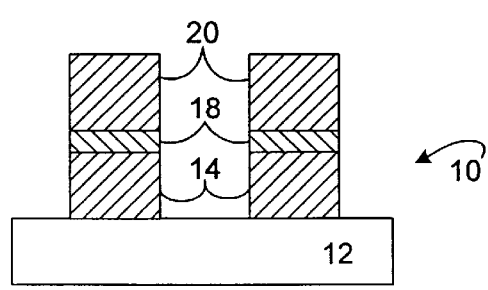
FIG. 5 illustrates a cross-sectional view of the methods according to one aspect of the present invention.

Referring to FIG. 5, the photoresist pattern 20 is then used as a mask in subsequent processing of the semiconductor structure 10. In particular, the photoresist pattern 20 is used as an etch mask for etching the exposed portions of the carbonized ARC 18 and the underlying layer 14 to conform with the photoresist pattern 20.

Figure 6:
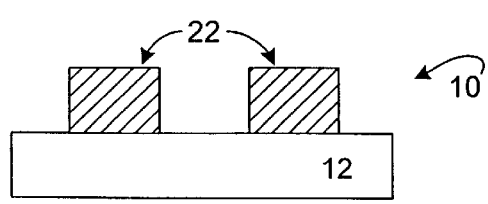
FIG. 6 illustrates a cross-sectional view of the methods according to one aspect of the present invention.

Referring to FIG. 6, the remaining portions of the photoresist pattern 20 and the carbonized ARC 18 are stripped to provide a patterned underlying layer 22. The structure 10 may then be subject to further processing.

Due to the presence of the carbonized ARC 18, energy which passes through the photoresist material during selective exposure of the photoresist material is not reflected back into the photoresist material by the underlying layer 14 to the extent it would have been reflected back without the carbonized ARC 18. As a result of the present invention, improved critical dimension control is achieved as the dimensions of the patterns and/or various openings in the patterned photoresist 20 are controllable, crisp and of high quality. Additional layers can be incorporated into semiconductor structure 10 so long as the carbonized ARC 18 can function at least as an antireflection layer.

Figure 7:
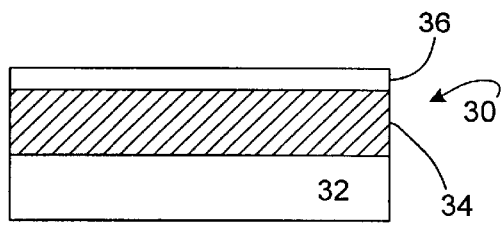
FIG. 7 illustrates a cross-sectional view of the methods according to another aspect of the present invention.

Referring to FIGS. 7 to 11, another embodiment of the present invention is described. Referring to FIG. 7, a portion of a semiconductor structure 30 is shown with silicon substrate 32. Underlying layer 34 (relative to the ARC) is positioned over the silicon substrate 32. One or more layers of semiconductor materials may be positioned between silicon substrate 32 and underlying layer 34. Although shown as continuous, the underlying layer 34 may be continuous or intermittent. In this embodiment, the underlying layer 34 is a polysilicon layer or a metal layer. A spin-on polymer layer 36 is formed using spin-coating techniques over the underlying polysilicon layer or metal layer 34 having a desired thickness, such as 600 Å. The polymer layer 36 is then heat treated to drive off any excess solvent.

Figure 8:
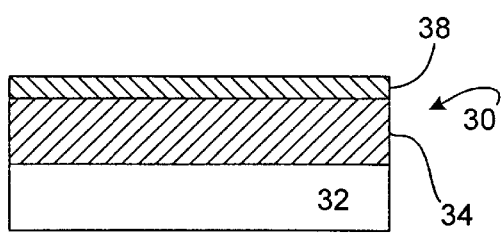
FIG. 8 illustrates a cross-sectional view of the methods according to another aspect of the present invention.

Referring to FIG. 8, a carbonized ARC 38 is formed over the underlying polysilicon layer or metal layer 34 by irradiating the spin-on polymer layer 36 with laser light in an inert atmosphere for a time sufficient to provide a desired degree of carbonization to the polymer layer, thereby forming a carbonized layer having a desired thickness, such as 500 Å. The degree of carbonization of the polymer layer and the thickness of the resultant carbonized layer may be modified to adjust the reflectivity of the resultant carbonized layer in light of the specific reflectivity of the underlying polysilicon layer or metal layer 34. In this embodiment, IR laser light is used to irradiate the spin-on polymer layer 36 in a nitrogen atmosphere or under a vacuum.

Figure 9:
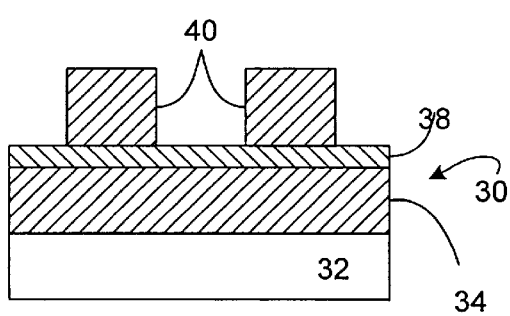
FIG. 9 illustrates a cross-sectional view of the methods according to another aspect of the present invention.

Referring to FIG. 9, a photoresist 40 is patterned over the carbonized ARC 38 using suitable photolithographic techniques. That is, a suitable photoresist material, such as a 193 nm sensitive photoresist, an I-line photoresist or a deep UV photoresist, is deposited over the carbonized ARC 38 using known techniques, such as using conventional spin-coating techniques, the photoresist material is selectively exposed to radiation, and the photoresist material is developed to yield a patterned photoresist 40. The patterned photoresist 40 is formed using electromagnetic radiation having a relatively small wavelength. For example, the photoresist pattern 40 is formed using electromagnetic radiation having a wavelength of about 365 nm, about 248 nm, and/or 193 nm. The exposed portion of the carbonized ARC 38 may have any desired cross-section, width or diameter, such as about 0.35 μm, about 0.25 μm, about 0.18 μm, about 0.15 μm, about 0.1 μm and/or about 0.05 μm.

Figure 10:
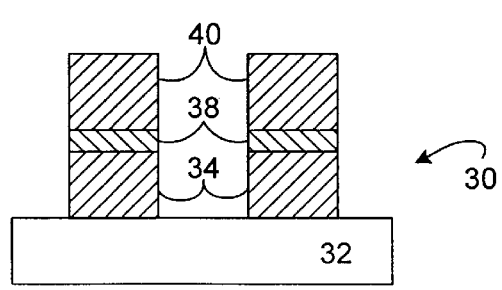
FIG. 10 illustrates a cross-sectional view of the methods according to another aspect of the present invention.

Referring to FIG. 10, the photoresist pattern 40 is then used as a mask in subsequent processing of the semiconductor structure 30. In particular, the photoresist pattern 40 is used as an etch mask for etching the exposed portions of the carbonized ARC 38 and the underlying polysilicon or metal layer 34 to conform with the photoresist pattern 40.

Figure 11:
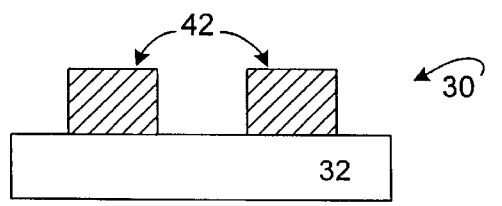
FIG. 11 illustrates a cross-sectional view of the methods according to another aspect of the present invention.

Referring to FIG. 11, the remaining portions of the photoresist pattern 40 and the carbonized ARC 38 are stripped to provide a patterned underlying polysilicon or metal layer 42. The structure 30 may then be subject to further processing.

Due to the presence of the carbonized ARC 38, energy which passes through the photoresist material during selective exposure of the photoresist material is not reflected back into the photoresist material by the underlying polysilicon or metal layer 34 to the extent it would have been reflected back without the carbonized ARC 38. As a result of the present invention, improved critical dimension control is achieved as the dimensions of the patterns and/or various openings in the patterned photoresist 40 are controllable, crisp and of high quality. Additional layers can be incorporated into semiconductor structure 30 so long as the carbonized ARC 38 can function at least as an antireflection layer.

The precise degree of carbonization of the polymer layer and the thickness of the resultant carbonized ARC determine the reflectivity of the resultant carbonized ARC, which in turn may be selected in light of the reflectivity of the specific underlying layer. Reflective notching in submicron photoresist patterns is thus minimized and/or eliminated by using the carbonized ARCs in accordance with the invention. Since the carbonized ARC may be made of the same material used for the photoresist, the inventive methods simplify processing and reduce costs associated with making conventional ARCs.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a carbonized antireflection coating comprising:

depositing a polymer layer on a surface of a semiconductor substrate for absorbing patterned illumination, the layer having a thickness; and carbonizing at least a portion of the polymer layer in an inert atmosphere to provide the carbonized antireflection coating, wherein the thickness and the portion are selected to control reflectivity of patterned illumination at a desired wavelength of illumination.

2. The method of claim 1, wherein the carbonized antireflection coating has a reflectivity from 0% to 15%, further comprising controlling the reflectivity by carbonizing from about 75% to 100% of the portion of the polymer layer carbonized.

3. The method of claim 1, wherein the carbonized antireflection coating has a reflectivity from 0% to about 15%, further comprising controlling the reflectivity by providing the carbonized antireflection coating with a thickness from about 200Å and 1500 Å.

4. The method of claim 1, wherein the polymer layer comprises one of a deep ultraviolet photoresist, an I-line photoresist and a 193 nm sensitive photoresist.

5. The method of claim 1, wherein the polymer layer is carbonized using one of a laser beam and an electron beam.

6. The method of claim 1, wherein the polymer layer is carbonized using one of an infrared laser and an excimer laser.

7. The method of claim 1, wherein at least 75% of the polymer layer is carbonized.

8. A method of improving critical dimensional control during lithography, comprising:

providing a semiconductor substrate;

depositing a polymer layer, having a thickness, on a surface of the semiconductor substrate;

carbonizing at least a portion of the polymer layer in an inert atmosphere to provide a carbonized antireflection coating, wherein the thickness and the portion are selected to control reflectivity of patterned illumination at a desired wavelength of illumination;

depositing a photoresist over the carbonized antireflection coating; and patterning the photoresist.

9. The method of claim 8, wherein the polymer layer comprises at least one organic material selected from polyesters, polyacrylates, polymethacrylates, polycarbonates, polyimides, polysulfones, polyureas, polystyrenes, polyaryl ethers, epoxy based polymers, and novolaks.

10. The method of claim 8, wherein the polymer layer has a thickness from 200 Å to 10,000 Å.

11. The method of claim 8, wherein the carbonized antireflection coating has a thickness between 500 Å and 900 Å.

12. The method of claim 8, wherein the inert atmosphere is one of a vacuum, a nitrogen atmosphere and a noble gas atmosphere.

13. The method of claim 8, wherein patterning the photoresist includes irradiating the photoresist with light having a wavelength from 130 nm to 400 nm.

14. The method of claim 8, wherein the carbonized antireflection coating has a reflectivity of less than about 5% at wavelengths from 240 nm to 365 nm.

15. A method of processing a semiconductor substrate, comprising:

providing a semiconductor substrate having an uppermost layer comprising polysilicon;

spin-coating a polymer layer, having a thickness, on the semiconductor substrate;

carbonizing a portion ranging from 75% to 100% of the polymer layer using an infrared laser to provide a carbonized antireflection coating, wherein the thickness and the portion are selected to control reflectivity of patterned illumination at a desired wavelength of illumination;

depositing a photoresist over the carbonized antireflection coating; and patterning the photoresist.

16. The method of claim 15, wherein the polymer layer comprises an organic polymer.

17. The method of claim 15, wherein the polymer layer comprises one of a 193 nm sensitive photoresist, a deep ultraviolet photoresist and an I-line photoresist.

18. The method of claim 15, wherein the carbonized antireflection coating has a thickness from 400 Å to about 1000 Å.

19. The method of claim 15, wherein the carbonized antireflection coating has a reflectivity of less than 10% at wavelengths from about 225 nm to about 375 nm.

20. The method of claim 15, wherein the polymer layer and the photoresist comprises the same material.

* * * * *